United States Patent
Kaneko et al.

(10) Patent No.: US 9,382,163 B2
(45) Date of Patent: Jul. 5, 2016

(54) AMORPHOUS DIELECTRIC FILM AND ELECTRONIC COMPONENT

(71) Applicant: TDK CORPORATION, Tokyo (JP)

(72) Inventors: Toshihiko Kaneko, Tokyo (JP); Saori Takeda, Tokyo (JP); Yuki Yamashita, Tokyo (JP); Junichi Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/310,212

(22) Filed: Jun. 20, 2014

(65) Prior Publication Data

US 2014/0378295 A1   Dec. 25, 2014

(30) Foreign Application Priority Data

Jun. 20, 2013 (JP) .................................. 2013-129678
Mar. 28, 2014 (JP) .................................. 2014-068512

(51) Int. Cl.
| | |
|---|---|
| *C04B 35/00* | (2006.01) |
| *C04B 35/49* | (2006.01) |
| *H01L 49/02* | (2006.01) |

(52) U.S. Cl.
CPC ............... *C04B 35/49* (2013.01); *H01L 28/40* (2013.01); *C04B 2235/3208* (2013.01); *C04B 2235/3213* (2013.01); *C04B 2235/3215* (2013.01); *C04B 2235/6562* (2013.01)

(58) Field of Classification Search
CPC ...... C04B 35/46; C04B 35/48; C04B 35/482; C04B 35/486; C04B 35/49
USPC .................................................. 501/134, 135
See application file for complete search history.

(56) References Cited

U.S. PATENT DOCUMENTS

| | | | |
|---|---|---|---|
| 5,104,690 A * | 4/1992 | Greenwald | ................. 427/126.3 |
| 5,866,492 A * | 2/1999 | Kim et al. | ..................... 501/134 |
| 2003/0013319 A1* | 1/2003 | Holmes et al. | ................ 438/761 |

(Continued)

FOREIGN PATENT DOCUMENTS

| | | | | |
|---|---|---|---|---|
| JP | A-2008-258555 | | 10/2008 | |
| WO | WO/2012/008041 | * | 1/2012 | ............... H01B 3/00 |

OTHER PUBLICATIONS

Chen et al. Metallo-organic decomposition derived (Ca,Sr)ZrO3 dielectric thin films on Pt coated Si substrate. Applied Surface Science 252 (2006) 7585-7589.*

(Continued)

*Primary Examiner* — Noah Wiese
(74) *Attorney, Agent, or Firm* — Oliff PLC

(57) ABSTRACT

The present invention aims to provide an amorphous dielectric film and an electronic component in which the relative permittivity and the temperature coefficient of electrostatic capacitance can be maintained and the withstand voltage can be increased even if the dielectric film is further thinned. The amorphous dielectric film of the present invention is characterized in that it is a dielectric film composed of an amorphous composition with A-B—O as the main component, wherein A contains at least two elements selected from the group consisting of Ba, Ca and Sr, and B contains Zr. When the main component of the dielectric film is represented by $(Ba_xCa_ySr_z)_\alpha$—B—O, x, y and z meet the conditions of $0 \le x \le 1$, $0 \le y \le 1$, $0 \le z \le 1$, respectively, $x+y+z=1$ and at least any two of x, y and z are 0.1 or more. When A/B is represented by $\alpha$, $0.5 \le \alpha \le 1.5$.

2 Claims, 4 Drawing Sheets

(56) References Cited

U.S. PATENT DOCUMENTS

| | | | |
|---|---|---|---|
| 2009/0169839 A1* | 7/2009 | Sugimoto et al. | 428/201 |
| 2009/0297804 A1* | 12/2009 | Paul et al. | 428/210 |
| 2010/0311564 A1* | 12/2010 | Phillps et al. | 501/138 |
| 2013/0165313 A1* | 6/2013 | Kijima et al. | 501/135 |

OTHER PUBLICATIONS

Yu, T. et al., "Preparation and characterization of sol-gel derived $CaZrO_3$ dielectric thin films for high-$k$ applications," *Physica B*, 2004, pp. 440-445, vol. 348.

\* cited by examiner

AMORPHOUS DIELECTRIC FILM AND ELECTRONIC COMPONENT

FIELD OF THE INVENTION

The present invention relates to an amorphous dielectric film and an electronic component.

BACKGROUND

As an example of the electronic component which uses dielectric films, the thin film capacitor, the thin film filter for high frequency or the like can be listed. These components are widely used as electronic components with small sizes and high performance. It is required that these components should have a higher capacitance, a small change on the electrostatic capacitance with respect to temperature and also should have excellent voltage resistance against a high voltage. Recently, as the devices with high functions such as the smart phones and the notebooks are to be further subjected to the downsizing and performance improvement, the same requirements to the electronic components also become stricter.

Based on such a requirement, for example the thinning of the dielectric film of the thin film capacitor is continuously progressing. If the film becomes thinner, the capacitance of the capacitor can be increased. However, on the other hand, the voltage resistance against a high voltage will deteriorate so that the desired property cannot be obtained.

For example, the amorphous SiOx film is usually used as the dielectric film for the DRAM capacitor of the semiconductor integrated circuit. However, when the same material is used in the thin film capacitor, the dielectric film should be further thinned to increase the capacitance as the relative permittivity of the amorphous $SiO_x$ is at a relatively low level of 2 to 3. In this respect, the thin film capacitor using the above mentioned material do not have good voltage resistance against a high voltage. Thus, in order to achieve the downsizing and the performance improvement of the thin film capacitor, it is necessary to replace the material with the dielectric material having a high relative permittivity, low temperature dependence of dielectric permittivity and a high withstand voltage.

With respect to, for example, the $CaZrO_3$ thin film disclosed in Non-Patent Document 1 which is the material having a high relative permittivity, an amorphous Ca—Zr—O thin film is formed by changing the temperature of the thermal treatment after the formation of the $CaZrO_3$ thin film. Here, the relative permittivity of the amorphous Ca—Zr—O dielectric is determined to be about 18, and the withstand voltage is about 3 to 3.5 MV/cm. However, the withstand voltage cannot be further increased.

Further, it is proposed in Patent Document 1 that the defect caused by the distortion at the interface between the metal and the dielectric can be inhibited by forming a thin film layer of the amorphous composite metallic oxides (the amorphous dielectric of the oxide of Ba and/or Sr and Ti) on a copper foil on which a metallic thin film layer containing at least one metal selected from the group consisting of Cr, Ni, Au and Ag is formed. In this respect, the insulativity can be ensured.

Non-Patent Document

Non-Patent Document 1: Science direct Physica B 348 (2004) 440-445, Preparation and characterization of sol-gel derived $CaZrO_3$ dielectric thin film for high-k applications.

Patent Document

Patent Document 1: JP-A-2008-258555

SUMMARY

In view of such a situation, the present invention aims to provide an amorphous dielectric film and an electronic component in which the relative permittivity and the temperature coefficient of electrostatic capacitance are maintained and the withstand voltage is elevated even if the dielectric film becomes thinner.

In order to achieve the goals mentioned above, the amorphous dielectric film used in the present invention is characterized in that it is a dielectric film composed of an amorphous composition with A-B—O as the main component, wherein, A contains at least two elements selected from the group consisting of Ba, Ca and Sr, and B contains the element Zr. When the main component of the dielectric film is represented by $(Ba_xCa_ySr_z)_\alpha$—B—O, x, y and z meet the conditions of $0 \leq x \leq 1$, $0 \leq y \leq 1$, $0 \leq z \leq 1$, respectively, $x+y+z=1$, and at least any two of x, y and z are 0.1 or more. In addition, when A/B is represented by $\alpha$, $0.5 \leq \alpha \leq 1.5$.

Preferably, B which contains the element Zr further contains the element Ti. When the main component of the dielectric film mentioned above is represented by $(Ba_xCa_ySr_z)_\alpha$—$(Ti_{1-w}Zr_w)$—O, $0.4 \leq w \leq 1$.

In the present invention, with the amorphous dielectric film described above, an amorphous dielectric film and an electronic component can be obtained in which the relative permittivity and the temperature coefficient of electrostatic capacitance are maintained and the withstand voltage is elevated when the dielectric film becomes thinner.

DETAILED DESCRIPTION OF EMBODIMENTS

Figure 1:
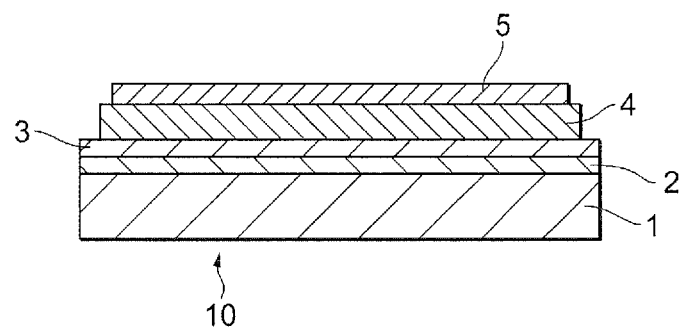
FIG. 1 is a sectional view of a thin film capacitor in an embodiment of the present invention.

Hereinafter, the present invention will be described based on embodiments shown in the drawings.

<Thin Film Capacitor 10>

FIG. 1 is a sectional view of the thin film capacitor 10 in an embodiment of the present invention. The thin film capacitor 10 is provided with a lower electrode 3 which is laminated on the surface of a supporting substrate 1, an upper electrode 5, and a dielectric film 4 disposed between the lower electrode 3 and the upper electrode 5. A ground layer 2 can be inserted between the supporting substrate 1 and the lower electrode 3 so as to improve the adhesion between the supporting substrate 1 and the lower electrode 3. The supporting substrate 1 functions to ensure the mechanical strength of the whole thin film capacitor 10.

The shape of the thin film capacitor is not particularly restricted and is usually prepared to be rectangular parallelepiped. The size is not particularly limited, either. The thickness or the length can be appropriately adjusted in accordance with applications.

<Supporting Substrate 1>

The material for forming the supporting substrate 1 shown in FIG. 1 is not particularly restricted. The supporting substrate 1 can be formed by the single crystal such as the Si single crystal, SiGe single crystal, GaAs single crystal, InP single crystal, $SrTiO_3$ single crystal, MgO single crystal, $LaAlO_3$ single crystal, $ZrO_2$ single crystal, $MgAl_2O_4$ single crystal and $NdGaO_3$ single crystal; the ceramic polycrystal substrate such as the $Al_2O_3$ polycrystal, $ZnO_2$ polycrystal and $SiO_2$ polycrystal; metals such as Ni, Cu, Ti, W, Mo, Al, Pt and the like; the substrate of the alloy thereof and the like, so there is no particular restriction on the material. Among these materials, the Si single crystal is typically used as the substrate because of its low cost and good process ability. The electrical resistivity of the supporting substrate 1 will be different depending on the material for forming the substrate. When a material with a low electrical resistivity is directly used as the substrate, the leak of current flowing towards the substrate side will affect the electrical properties of the thin film capacitor 10. In this respect, in some cases, an insulating treatment is applied to the surface of the supporting substrate 1 so that the current during the use will not flow to the supporting substrate 1. For example, when the Si single crystal is used as the supporting substrate 1, the surface of the supporting substrate 1 can be oxidized to form a $SiO_2$ insulating layer, or an insulator such as $Al_2O_3$, $SiO_2$, $Si_3N_x$ and the like can be formed on the surface of the supporting substrate 1. There is no particular restriction on the material or the thickness of the insulating layer as long as the supporting substrate 1 can be maintained to be insulated. The thickness of the insulating layer is preferred to be 0.01 μm or more. It is not preferable that the thickness of the insulating layer is less than 0.01 μm because the insulativity may not be retained.

If the mechanical strength of the whole thin film capacitor can be maintained, the thickness of the supporting substrate 1 will not be particularly restricted. For example, the thickness can be set to be 10 to 5000 μm. If the thickness is less than 10 μm, the mechanical strength cannot be maintained. If the thickness is more than 5000 μm, a problem will rise that it will not be helpful to the downsizing of the electronic components.

<Ground Layer 2>

In the present invention, the thin film capacitor 10 shown in FIG. 1 preferably has a ground layer 2 on the surface of the supporting substrate 1 to which the insulating treatment has been applied. The ground layer 2 is inserted to improve the adhesion between the supporting substrate 1 and the lower electrode 3. For example, when Cu is used in the lower electrode 3, Cr is usually inserted as the ground layer 2. On the other hand, when Pt is used in the lower electrode 3, Ti is usually inserted as the ground layer 2. It is not particularly restricted in the materials mentioned above as long as the ground layer 2 aims to improve the adhesion. In addition, if the adhesion between the supporting substrate 1 and the lower electrode 3 can be maintained, the ground layer 2 can also be omitted.

<Lower Electrode 3>

The material for forming the lower electrode 3 should have electrical conductivity. For example, the lower electrode 3 can be formed by the metal such as Pt, Ru, Rh, Pd, Ir, Au, Ag, Cu, Ni and the like; the alloy thereof or the conductive oxide thereof. Thus, the material can be selected corresponding to the cost or the atmosphere used during the thermal treatment of the dielectric layer 4. Besides the air, the thermal treatment to the dielectric layer 4 can also be performed under $N_2$ or Ar (which is the inert gas) or a mixed gas of $O_2$, an inert gas and $H_2$ (which is a reductive gas). The film thickness of the lower electrode 3 can be set to be any value as long as the lower electrode 3 can function as an electrode. In addition, the film thickness is preferred to be 0.01 μm or more. It is not preferable if the film thickness is less than 0.01 μm because the electrical conductivity will become bad. In addition, when a substrate using the conductive material such as Cu, Ni and Pt or the oxide thereof which can be employed as the electrode is used as the supporting substrate 1, the ground layer 2 and the lower electrode 3 mentioned above can be omitted.

After the formation of the lower electrode 3, a thermal treatment can be done to improve the adhesion between the ground layer 2 and the lower electrode 3 and also to improve the stability of the lower electrode 3. During the thermal treatment, the rising rate of the temperature is preferably 10 to 2000° C./minute, and more preferably 100 to 1000° C./minute. The temperature to be kept during the thermal treatment is preferably 400 to 800° C., and the duration is preferably 0.1 to 4 hours. If the parameters are beyond the ranges mentioned above, the adhesion will be bad and the surface of the lower electrode 3 will become rough. In this respect, the dielectric properties of the dielectric layer 4 will deteriorate.

<Dielectric Layer 4>

The dielectric layer 4 is composed of the amorphous dielectric film of the present embodiment. The dielectric film 4 consists of the amorphous composition with A-B—O as the main component, wherein A contains at least two elements selected from the group consisting of Ba, Ca and Sr, and B contains Zr.

In addition, when the main component of the dielectric film 4 is represented by $(Ba_xCa_ySr_z)_\alpha$—B—O, x, y and z meet the conditions of $0 \leq x \leq 1$, $0 \leq y \leq 1$, $0 \leq z \leq 1$, respectively, $x+y+z=1$, and at least any two of x, y and z are 0.1 or more. In addition, when A/B is represented by $\alpha$, $0.5 \leq \alpha \leq 1.5$.

Generally speaking, it is well known that the amorphous material forms a cluster which will become the nucleus of the crystal. With a thermal treatment, the long periodic arrangement of the cluster is formed and the cluster will grow into a crystal. With respect to the composition in the present embodiment, it is presumed that $(Ba_xCa_ySr_z)_\alpha ZrO_3$ is contained in the cluster which is to form the nucleus of the crystal. Further, the withstand voltage can be elevated by shortening the distance among the oxygen which combines to the metal, elevating the melting point of the substance and increasing the broken-bond charge. In the present embodiment, as the Ba, Ca, Sr and Zr which bind to the oxygen are mixed in the amorphous dielectric, they are compressed each other and the average distance between the metallic element and the oxygen is shortened. In this way, it is thought that the withstand voltage is elevated. Thus, it is necessary to prepare a dielectric film 4 with the first oxide and the second oxide as the main components, wherein, the first oxide is the oxide of at least two selected from the group consisting of Ba, Ca and Sr, and the second oxide contains Zr. The main components should fall within the ranges mentioned above.

If at least any two of x, y and z are less than 0.1, the compression effect will be weakened and the withstand voltage will become lower.

In the dielectric film 4, it is preferable that B which contains Zr further contains Ti. In addition, when the main component of the dielectric film mentioned above is represented by $(Ba_xCa_ySr_z)_\alpha$—$(Ti_{1-w}Zr_w)$—O, $0.4 \leq w \leq 1$.

The effect of the present embodiment will be improved if B which contains Zr further contains Ti and the ranges fall within those mentioned above.

The thickness of the dielectric film 4 is preferably 10 to 2000 nm, and more preferably 50 to 1000 nm. If the thickness is less than 10 nm, the insulativity is likely to be destroyed. On the other hand, if the thickness is above 2000 nm, the area of the electrode will be necessarily widened so as to increase the electrostatic capacitance of the capacitor. However, it is not good for the downsizing of the electronic components, so such thicknesses are not preferable. In the measurement of the thickness of the dielectric film, the dielectric film can be cut by a focused ion beam (FIB) processing device. Then the section is observed by a scanning ion microscope (SIM), and the length is measured.

The dielectric film 4 is formed by using various methods for deposition such as the vacuum deposition method, the sputtering method, the pulsed laser deposition method (PLD), the metal organic chemical vapor deposition method (MOCVD), the metal organic decomposition method (MOD), the sol-gel method, the chemical solution deposition method (CSD) and the like. During the formation, the raw materials (the material for deposition, various target materials, the organometallic material or the like) may sometimes contain a little amount of impurities. It will not be a problem if impurities are not contained in a great amount that may greatly deteriorate the insulativity.

After the formation of the dielectric film 4, a thermal treatment is preferably done. Even if the thermal treatment is not be done, the effect of the present invention will be kept. However, the effect will be worsened under the influence of defects or the like.

As the condition of the thermal treatment, the rising rate of the temperature is preferably 10 to 2000° C./minute, and more preferably 100 to 1000° C./minute. The temperature kept during the thermal treatment is preferably 200 to 600° C., and more preferably 300 to 600° C. In addition, the duration is preferably 0.1 to 4 hours. If these parameters are beyond the ranges mentioned above, bad adhesion will occur and the surface of the lower electrode 3 and that of the dielectric layer 4 will become rough so that the dielectric property of the dielectric layer 4 will deteriorate.

Further, the dielectric layer 4 usually consists of only the dielectric film of the present invention. However, the dielectric layer 4 can also form a laminated structure with other dielectric films. For example, in order to adjust the impedance and the temperature coefficient of electrostatic capacitance, the dielectric layer 4 can form a laminated structure with the conventional amorphous dielectric film or the crystal thin film of $Si_3N_x$, $SiO_x$, $Al_2O_x$, $ZrO_x$ and $Ta_2O_x$. In this way, other properties can be adjusted with the withstand voltage being maintained.

<Upper Electrode 5>

In an example of the present embodiment, the thin film capacitor 10 contains the upper electrode 5 on the surface of the dielectric film 4, wherein the upper electrode 5 functions as another electrode of the thin film capacitor 10. The material for forming the upper electrode 5 is not particularly restricted as long as it has the electric conductivity. The upper electrode 5 can be formed by using the same material as for the lower electrode 3. The film thickness of the upper electrode 5 is not restricted as long as the upper electrode 5 will function as an electrode. In addition, the film thickness is preferably 0.01 μm or more. If the film thickness is 0.01 μm or less, such an upper electrode 5 is not preferable as the electric conductivity is deteriorated.

In the embodiment described above, the thin film capacitor is shown as an electronic component of the present invention. However, the electronic component of the present invention is not limited to the thin film capacitor. For example, the electronic component can be one with a dielectric film such as a balun, a coupler, a band-pass filter or the like.

EXAMPLES

Hereinafter, the present invention will be more specifically described based on the Examples. However, the present invention will not be limited to these Examples.

Example 1

Comparative Example 1

First of all, a Ti film (which was the ground layer) with a thickness of 20 nm was formed by sputtering on the surface of the substrate of 10 mm×10 mm square, wherein the substrate was provided with a $SiO_2$ insulating film of 6 μm on its Si surface of 350 μm.

Next, a Pt film (which was the lower electrode) with a thickness of 100 nm was formed by sputtering on the Ti film formed above.

A thermal treatment was provided to the formed Ti/Pt film under oxygen atmosphere with an ordinary pressure, wherein the rising rate of the temperature is 400° C./minute, the temperature is kept on 700° C., the temperature is kept for 30 minutes.

In order to determine the surface roughness of the sample after the thermal treatment, an AFM (atomic force microscope) was used. It was confirmed that Ra (the calculated average roughness) was 4 nm or less, Rz (the maximum height) was 50 nm or less and no abnormal roughness was present on the surface of the lower electrode in all the samples. The number of the measuring point was 9 and the scanning range for each point was 10 μm×10 μm. Ra was determined as the average value of Ra at 9 points and Rz was determined as the maximum Rz at 9 points.

In the formation of the dielectric film, the PLD method was used. The targets necessary for the formation of the dielectric film were prepared as follows.

First of all, $BaCO_3$, $CaCO_3$, $SrCO_3$ and $ZrO_2$ were weighted in accordance with the amounts of Ba, Ca and Sr (x, y and z) and the ratio (α) of their sum to Zr of Samples 1 to 21 as shown in Table 1. In this respect, the raw materials were prepared.

TABLE 1

| | Sample No. | amorphous | composition | | | | | | | | | | relative permittivity | TCC (ppm/° C.) | Withstand voltage (MV/cm) |
| | | | A | | | B | | | | | | | | | |
| | | | BaO | CaO | SrO | $TiO_2$ | $ZrO_2$ | x | y | z | w | α | | | |
|---|---|---|---|---|---|---|---|---|---|---|---|---|---|---|---|
| Example 1 | 1 | ○ | | ○ | ○ | | ○ | 0 | 0.5 | 0.5 | 1 | 1 | 25 | 150 | 5.4 |
| | 2 | ○ | ○ | ○ | | | ○ | 0.5 | 0.5 | 0 | 1 | 1 | 24 | 180 | 5.5 |

TABLE 1-continued

| | Sample No. | amorphous | composition A BaO | CaO | SrO | composition B TiO₂ | ZiO₂ | x | y | z | w | α | relative permittivity | TCC (ppm/°C.) | Withstand voltage (MV/cm) |
|---|---|---|---|---|---|---|---|---|---|---|---|---|---|---|---|
| | 3 | o | o | | o | | o | 0.5 | 0 | 0.5 | 1 | 1 | 24 | 230 | 5.5 |
| | 4 | o | | o | o | | o | 0 | 0.9 | 0.1 | 1 | 1 | 25 | 190 | 5.2 |
| | 5 | o | | o | o | | o | 0 | 0.1 | 0.9 | 1 | 1 | 24 | 200 | 5.1 |
| | 6 | o | o | o | | | o | 0.1 | 0.9 | 0 | 1 | 1 | 24 | 200 | 5.3 |
| | 7 | o | o | o | | | o | 0.9 | 0.1 | 0 | 1 | 1 | 25 | 220 | 5.2 |
| | 8 | o | o | | o | | o | 0.9 | 0 | 0.1 | 1 | 1 | 24 | 210 | 5.1 |
| | 9 | o | o | | o | | o | 0.1 | 0 | 0.9 | 1 | 1 | 25 | 220 | 5.1 |
| | 10 | o | o | o | o | | o | 0.3 | 0.35 | 0.35 | 1 | 1 | 25 | 200 | 5.4 |
| | 11 | o | o | o | o | | o | 0.2 | 0.6 | 0.2 | 1 | 1 | 26 | 190 | 5.5 |
| | 12 | o | o | o | o | | o | 0.2 | 0.2 | 0.6 | 1 | 1 | 25 | 190 | 5.4 |
| | 13 | o | o | o | o | | o | 0.05 | 0.05 | 0.9 | 1 | 1 | 26 | 210 | 5.3 |
| | 14 | o | o | o | o | | o | 0.05 | 0.9 | 0.05 | 1 | 1 | 25 | 180 | 5.3 |
| | 15 | o | o | o | o | | o | 0.9 | 0.05 | 0.05 | 1 | 1 | 24 | 220 | 5.2 |
| Comparative Example 1 | 16 | o | | o | | | o | 0 | 1 | 0 | 1 | 1 | 24 | 180 | 3.6 |
| | 17 | o | o | | | | o | 1 | 0 | 0 | 1 | 1 | 25 | 200 | 3.6 |
| | 18 | o | | | o | | o | 0 | 0 | 1 | 1 | 1 | 24 | 220 | 3.8 |
| | 19 | o | o | o | o | | o | 0.95 | 0.025 | 0.025 | 1 | 1 | 25 | 200 | 4.0 |
| | 20 | o | o | o | o | | o | 0.025 | 0.025 | 0.95 | 1 | 1 | 24 | 210 | 3.9 |
| | 21 | o | o | o | o | | o | 0.025 | 0.95 | 0.025 | 1 | 1 | 24 | 190 | 4.1 |

Thereafter, the prepared raw materials, water and the zirconia beads of ϕ2 mm were put into a ball mill and a wet blending was conducted for 20 hours. After that, the slurry of the mixed powder was dried at 100° C. for 20 hours.

Then, 10 wt % (relative to the resulting mixed powder) of PVA (polyvinyl alcohol) was put into a mortar, and a pestle was used to prepare the granulated powder. After that, the granulated powder of 5 mm in depth was put into a mold of ϕ200 mm. Next, a molded body was obtained by using a uniaxial press. The molding process was done at Room Temperature with a pressure of $2.0 \times 10^8$ Pa. Thereafter, a debinding process and a firing process were provided to the molded body with the following conditions.

With respect to condition for the debinding process, the rising rate of the temperature was 25° C./hour and the temperature was kept at 400° C. In addition, the temperature was kept for 4 hours and the atmosphere was the air.

With respect to condition for the firing process, the rising rate of the temperature was 200° C./hour and the temperature was kept at 1200° C. to 1300° C. In addition, the temperature was kept for 4 hours and the atmosphere was the air.

Then, both sides of the obtained sintered body were polished by a cylindrical grinding machine so as to provide the sintered body with a thickness of 4 mm. In this way, the targets for PLD were obtained which were necessary for the formation of the dielectric film.

The dielectric film was formed with a thickness of 600 nm on the lower electrode by the PLD method using the resulting targets for PLD. With respect to the conditions for the deposition via the PLD method, the oxygen pressure was adjusted to $1 \times 10^{-2}$ (Pa) and the substrate was not heated during the deposition. In addition, in order to expose part of the lower electrode, a metal mask was used to form a region where part of the dielectric film was not formed.

Then, the formed dielectric film was provided with a thermal treatment in the air, wherein the rising rate of the temperature is 600° C./min, the temperature is kept at 500° C. and the temperature is kept for 10 minutes.

In the measurement of the thickness of the dielectric film, the dielectric film was drilled by a focused ion beam (FIB) processing device. Then, the obtained the section was observed by a scanning ion microscope (SIM) and the length was measured.

As for all the samples, the composition of the dielectric film after the deposition was measured by using a XRF (X-ray Fluorescence Spectrometer). In this way, the dielectric films were confirmed to have the compositions listed in Table 1 to Table 4.

Thereafter, in order to form a Pt electrode (which was the upper electrode) on the obtained dielectric film, a sputtering device was used to perform the deposition. The Pt electrode was formed by using a metal mask to have a diameter of 5 mm and a thickness of 200 nm. In this way, Samples 1 to 21 were obtained with the structure shown in FIG. 1. The film thickness of the platinum electrode was also measured by firstly drilling the film with a focused ion beam (FIB) processing device. Then, the obtained section was observed by a scanning ion microscope (SIM) and the length was measured.

As for all the obtained samples of the thin film capacitor, the withstand voltage, the relative permittivity and the temperature property of the electrostatic capacitance were each measured by the methods shown below.

<Withstand Voltage>

The withstand voltage was measured by connecting a digital ultra-high resistance/micro current meter (ADVANTEST R8340) with the exposed region of the lower electrode and the upper electrode corresponding to the thin film capacitor and then applying a voltage in a step of 5V/second. The value of the voltage was read when the resistance was decreased from the initial resistance value by 2 digits and the obtained value was deemed as the value of the breakdown voltage (V). The value obtained by dividing the breakdown voltage (V) by the thickness of the dielectric film was used as the withstand voltage (MV/cm) and was described in Table 1. The withstand voltage was preferred to be high, and a withstand voltage of 5 MV/cm or higher was deemed as a good one.

<Relative Permittivity>

The relative permittivity (no unit) was calculated from measurement results of the electrostatic capacitance of the thin film thickness. The electrostatic capacitance of the thin film capacitor was measured by a digital LCR meter (4274A, produced by YHP) at a reference temperature of 25° C. with a frequency of 1 MHz and an input signal level (the measurement voltage) of 0.1 Vrms.

<Temperature Coefficient of Electrostatic Capacitance, TCC>

The electrostatic capacitance of the thin film capacitor was measured in a thermostat of −55, −25, −10, 25, 85 or 125° C. The capacitance was measured under a condition which was the same as that for the relative permittivity. Specifically, the capacitance was measured with a frequency of 1 MHz and an input signal level (the measurement voltage) of 0.1 Vrms. When the reference temperature was controlled to be 25° C., it was evaluated whether the temperature coefficient of electrostatic capacitance respect to the temperature was within 300 ppm/° C. The temperature coefficient of electrostatic capacitance TCC (ppm/° C.) was calculated according to the following Equation 1. However, in Equation 1, $C_{125}$ represented the electrostatic capacitance (Farad, F) at a temperature of 125° C., and $C_{25}$ represented the electrostatic capacitance (F) at a temperature of 25° C.

$$\text{TCC}(1\text{ MHz}) = [(C_{125} - C_{25})/C_{25}] \times (1/100) \quad (1)$$

<To Confirm Whether Dielectric Film was Amorphous>

Figure 2:
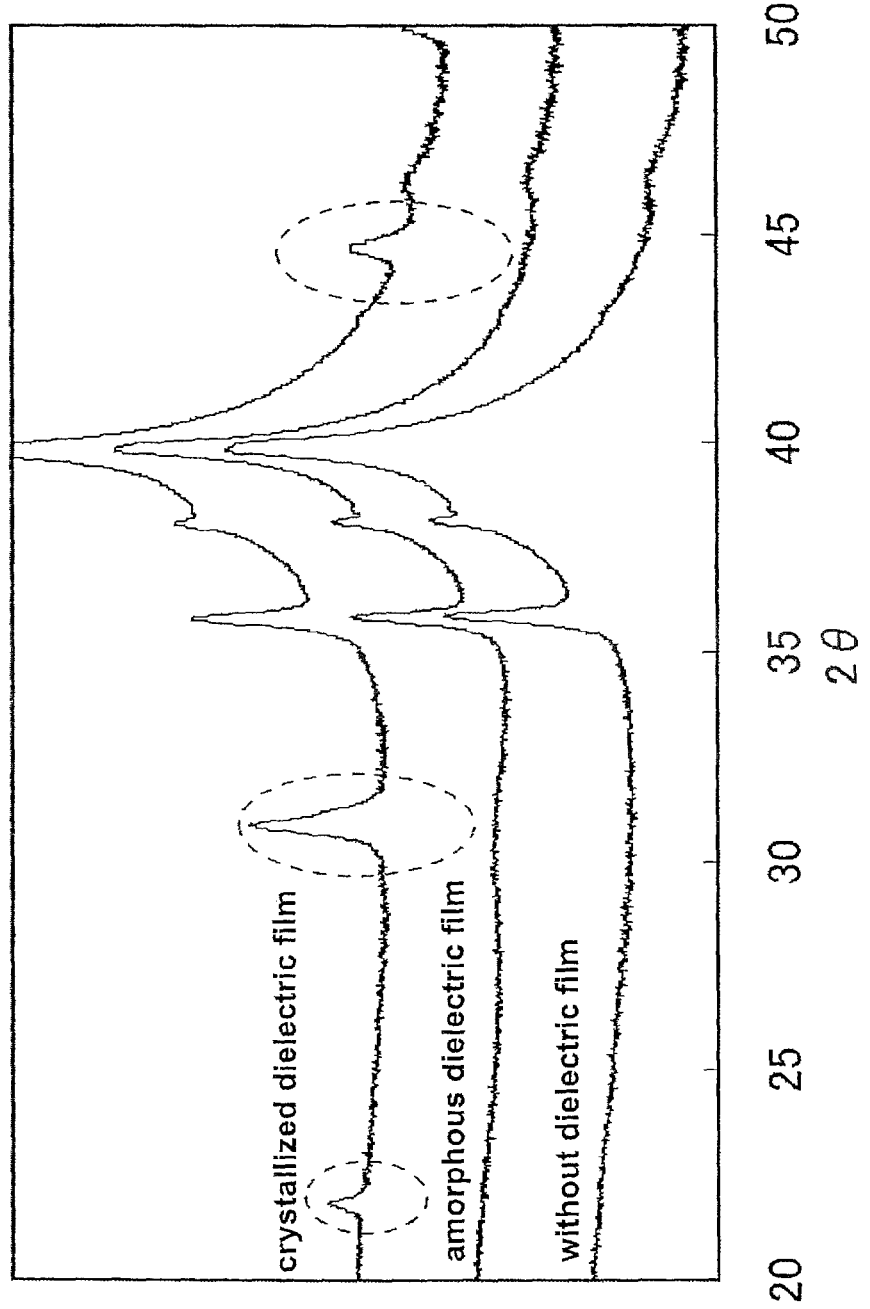
FIG. 2 shows the X-ray diffraction patterns when the lower electrode (Pt) is film-formed on the supporting substrate of Si single crystal with a $SiO_2$ insulating film attached, when the amorphous dielectric film is further formed thereon, and when the crystallized dielectric film is formed.

As for the sample of the thin film capacitor, the dielectric film was measured by the X-ray diffraction (the parallel beam method) and was observed by a transmission electron microscope (TEM) so as to determine if the dielectric film was amorphous or not. The Cu—Kα ray was used as the source of the X-ray in the X-ray diffraction. The measurement condition was as follows. The voltage was 45 kV and 2θ was 20° to 50°. FIG. 2 showed an example of the obtained diffraction pattern. The horizontal axis represented the angle of diffraction (2θ) and the vertical axis represented the intensity. The lower segment of FIG. 2 showed the diffraction pattern obtained after the deposition of the lower electrode on the supporting substrate. The middle segment showed the diffraction pattern obtained after the amorphous dielectric film was formed on the lower electrode. And the upper segment showed the common diffraction pattern of the (BaCaSr)(ZrTi)O₃ crystalline film formed on the lower electrode. With respect to all the samples, it was determined that whether a peak was present around 22°, 31 to 32° and 45° when the same materials crystallized. The sample without a peak was deemed as the amorphous one.

Figure 3:
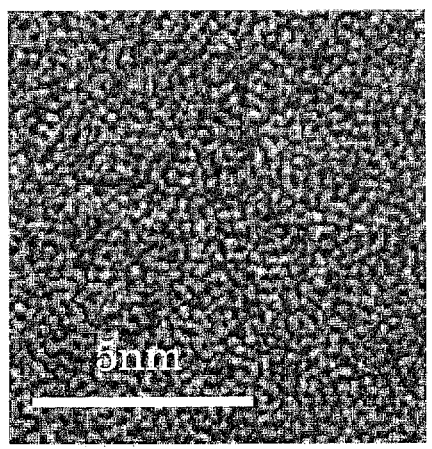
FIG. 3 is the photograph of the amorphous dielectric film observed by a transmission electron microscope.
Figure 4:
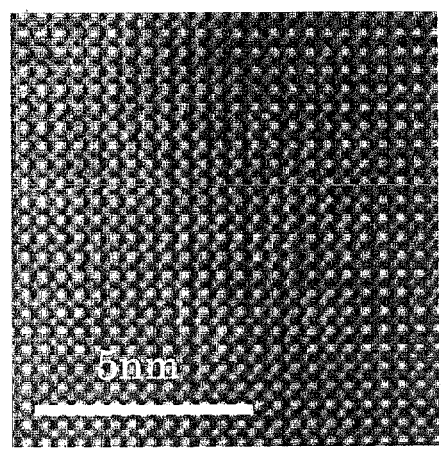
FIG. 4 is the photograph of the crystallized dielectric film observed by a transmission electron microscope.

As shown in FIG. 3 and FIG. 4, the dielectric was further observed by TEM to determine whether a lattice image (the lattice fringe) was present. The sample without a lattice fringe as shown in FIG. 3 was deemed as the amorphous one. The sample deemed as an amorphous one by both the X-ray diffraction and TEM was determined as an amorphous dielectric. All the prepared samples were amorphous dielectrics.

Samples 1 to 15

It can be seen from Table 1 that the dielectric film was composed of the amorphous composition with A-B—O as the main component, wherein A contained at least two elements selected from the group consisting of Ba, Ca and Sr, B contained Zr. When the main component of the dielectric film mentioned above was represented by $(Ba_xCa_ySr_z)_\alpha$—B—O and x, y and z meet the conditions of $0 \leq x \leq 1$, $0 \leq y \leq 1$, $0 \leq z \leq 1$, respectively, x+y+z=1 and at least any two of x, y and z were 0.1 or more. In such dielectric film, the withstand voltage was high, the relative permittivity and the temperature coefficient of electrostatic capacitance would not be deteriorated.

Sample 16 to 18

It can be seen from Table 1 that the withstand voltage would not increase when A contained only one element in the dielectric film which was composed of the amorphous composition with A-B—O as the main component.

Samples 19 to 21

It can be seen from Table 1 that the dielectric film was composed of the amorphous composition with A-B—O as the main component, wherein A contained at least two elements selected from the group consisting of Ba, Ca and Sr, and B contained Zr. When the main component of the dielectric film was represented by $(Ba_xCa_ySr_z)_\alpha$—B—O, x, y and z meet the conditions of $0 \leq x \leq 1$, $0 \leq y \leq 1$, $0 \leq z \leq 1$, respectively, x+y+z=1. If any two of x, y and z didn't fall within the range of 0.1 or more, the withstand voltage would not be elevated.

Example 2

Comparative Example 2

The amounts of Ba, Ca and Sr were set as x=0.3, y=0.35 and z=0.35, and BaCO₃, CaCO₃, SrCO₃, ZrO₂ and TiO₂ were weighted with the ratio (α) of the sum of Ba, Ca and Sr to the sum of Zr and Ti being as those shown in Table 2. In this respect, the targets were prepared. The thin film capacitors of Samples 22 to 28 were prepared as in Example 1 except for the composition of the targets. In addition, the same evaluations were performed as in Example 1. The results were shown in Table 2.

TABLE 2

| | sample | | composition | | | | | | | | | | relative | TCC | withstand voltage |
| | | | A | | | B | | | | | | | | | |
| | No. | amorphous | BaO | CaO | SrO | TiO₂ | ZrO₂ | x | y | z | w | α | permittivity | (ppm/° C.) | (MV/cm) |
|---|---|---|---|---|---|---|---|---|---|---|---|---|---|---|---|
| Example 2 | 22 | ○ | ○ | ○ | ○ | | ○ | 0.3 | 0.35 | 0.35 | 1 | 1.2 | 25 | 230 | 5.8 |
| | 23 | ○ | ○ | ○ | ○ | | ○ | 0.3 | 0.35 | 0.35 | 1 | 1.35 | 24 | 210 | 5.5 |
| | 24 | ○ | ○ | ○ | ○ | | ○ | 0.3 | 0.35 | 0.35 | 1 | 1.5 | 24 | 240 | 5.2 |
| | 25 | ○ | ○ | ○ | ○ | | ○ | 0.3 | 0.35 | 0.35 | 1 | 0.8 | 24 | 210 | 5.8 |
| | 26 | ○ | ○ | ○ | ○ | | ○ | 0.3 | 0.35 | 0.35 | 1 | 0.5 | 25 | 240 | 5.6 |
| Comparative | 27 | ○ | ○ | ○ | ○ | | ○ | 0.3 | 0.35 | 0.35 | 1 | 1.8 | 24 | 240 | 4.2 |
| Example 2 | 28 | ○ | ○ | ○ | ○ | | ○ | 0.3 | 0.35 | 0.35 | 1 | 0.4 | 25 | 260 | 4.0 |

Samples 22 to 26

It can be seen from Table 2 that when the ratio (α) of the sum of Ba, Ca and Sr to the sum of Zr and Ti was 0.5≤α≤1.5, the withstand voltage was high, the relative permittivity and the temperature coefficient of electrostatic capacitance would not be deteriorated.

Samples 27 to 28

It can be seen from Table 2 that when the ratio (α) of the sum of Ba, Ca and Sr to the sum of Zr and Ti was beyond the range of 0.5≤α≤1.5, the withstand voltage would not increase.

Example 3

Comparative Example 3

The $BaCO_3$, $CaCO_3$, $SrCO_3$, $ZrO_2$ and $TiO_2$ were weighted in accordance with the ratio (w) of Zr to Ti as shown in Table 3, and then the targets were prepared. The thin film capacitors of Samples 29 to 32 were prepared as in Example 1 except for the composition of the targets. In addition, the same evaluations were performed as in Example 1. The results were shown in Table 3.

main component, when B did not contain Zr, the withstand voltage would not be increased.

Example 4

The sample was prepared by the same method as for Sample 30 in Example 3 except that the deposition of the dielectric film was performed by sputtering. The same evaluations were performed as in Example 1, and the results were shown in Table 4.

Example 5

The sample was prepared by the same method as in Example 1 except that the thermal treatment after the deposition of the dielectric film was conducted at 200° C. The same evaluations were performed as in Example 1 and the results were shown in Table 4.

Example 6

A Cu foil with a thickness of 100 μm was prepared as the substrate of the thin film capacitor. The buffing/polishing process was conducted to make Ra (which showed the surface

TABLE 3

|  | sample No. | amorphous | composition | | | | | | | | | | relative permittivity | TCC (ppm/° C.) | withstand voltage (MV/cm) |
|  |  |  | A | | | B | | | | | | | | | |
|  |  |  | BaO | CaO | SrO | $TiO_2$ | $ZrO_2$ | x | y | z | w | α | | | |
| --- | --- | --- | --- | --- | --- | --- | --- | --- | --- | --- | --- | --- | --- | --- | --- |
| Example 3 | 1 | ○ |  |  | ○ | ○ |  | ○ | 0 | 0.5 | 0.5 | 1 | 1 | 25 | 150 | 5.4 |
|  | 10 | ○ | ○ | ○ | ○ |  | ○ | 0.3 | 0.35 | 0.35 | 1 | 1 | 25 | 200 | 5.4 |
|  | 29 | ○ |  | ○ | ○ | ○ | ○ | 0 | 0.5 | 0.5 | 0.4 | 1 | 26 | 240 | 5.8 |
|  | 30 | ○ |  | ○ | ○ | ○ | ○ | 0 | 0.5 | 0.5 | 0.75 | 1 | 25 | 220 | 6.1 |
|  | 31 | ○ |  | ○ | ○ | ○ | ○ | 0 | 0.5 | 0.5 | 0.95 | 1 | 25 | 170 | 6.2 |
|  | 32 | ○ | ○ | ○ | ○ | ○ | ○ | 0.3 | 0.35 | 0.35 | 0.95 | 1 | 25 | 200 | 6.3 |
|  | 33 | ○ |  | ○ | ○ | ○ | ○ | 0 | 0.5 | 0.5 | 0.3 | 1 | 27 | 250 | 5.4 |
| Comparative Example 3 | 34 | ○ | ○ |  |  | ○ | ○ | 0.5 | 0.5 | 0 | 0 | 1 | 29 | 290 | 2.9 |

Samples 29 to 32

It can be seen from Table 3 that in the dielectric film composed of the amorphous composition with A-B—O as the main component, when B which contained Zr further contained Ti in a preferable range of the present invention, the relative permittivity and the temperature coefficient of electrostatic capacitance did not deteriorate and the withstand voltage can be increased.

Sample 33

It can be seen from Table 3 that in the dielectric film composed of the amorphous composition with A-B—O as the main component, when B which contained Zr further contained Ti but the content of Ti was not within the preferable range of the present invention, the withstand voltage would not be increased.

Sample 34

It can be seen from Table 3 that in the dielectric film composed of the amorphous composition with A-B—O as the roughness of the Cu foil) to be 4 nm or less and to make Rz to be 50 nm or less. The surface roughness of the Cu foil was determined by the same method as in Example 1. The polished foil was washed in acetone, ethanol and ultrapure water in order by using an ultrasonic cleaner.

Then, the deposition of the dielectric film was provided to the cleaned Cu foil by the same method as in Example 1.

The thermal treatment to the dielectric film was done under a mixed gas of the inert $N_2$ and the reductive $H_2$ with the partial pressure of oxygen being $10^{-8}$ Pa. The rising rate of the temperature, the temperature to be kept and the duration were the same as in Example 1, and the same evaluations were done as in Example 1. The results were shown in Table 4.

Example 7

The sample was prepared by the same method as in Example 1 except that the thickness of the dielectric film was prepared to be 400 nm. Further, the same evaluations were done as in Example 1. The results were shown in Table 4.

TABLE 4

| sample | | composition | | | | | | | | | | relative | TCC | Withstand voltage | |
|---|---|---|---|---|---|---|---|---|---|---|---|---|---|---|---|
| | | | A | | | B | | | | | | | | | |
| | No. | amorphous | BaO | CaO | SrO | TiO$_2$ | ZrO$_2$ | x | y | z | w | α | permittivity | (ppm/°C.) | (MV/cm) | notes |
| Example 4 | 35 | ○ | | ○ | ○ | | ○ | 0 | 0.5 | 0.5 | 1 | 1 | 24 | 140 | 5.4 | deposition: sputtering |
| Example 5 | 36 | ○ | | ○ | ○ | | ○ | 0 | 0.5 | 0.5 | 1 | 1 | 25 | 160 | 5.5 | temperature during the thermal treatment: 200° C. |
| Example 6 | 37 | ○ | | ○ | ○ | | ○ | 0 | 0.5 | 0.5 | 1 | 1 | 26 | 150 | 5.6 | substrate: Cu foil of 100 μm |
| Example 7 | 38 | ○ | | ○ | ○ | | ○ | 0 | 0.5 | 0.5 | 1 | 1 | 25 | 150 | 5.6 | thickness of dielectric: 400 nm |

Samples 35 to 38

It can be known from Table 4 that the dielectric film was composed of the amorphous composition with A-B—O as the main component, wherein A contained at least two elements selected from the group consisting of Ba, Ca and Sr, and B contained Zr. When the main component of the dielectric film was represented by $(Ba_xCa_ySr_z)_\alpha$—B—O and x, y and z meet the conditions of $0 \le x \le 1$, $0 \le y \le 1$, $0 \le z \le 1$, respectively, $x+y+z=1$ and at least any two of x, y and z were 0.1 or more, the withstand voltage would be high, the relative permittivity and the temperature coefficient of electrostatic capacitance would not be lowered even if the production method for the dielectric film (Sample 35), the condition of the thermal treatment provided to the dielectric film (Sample 36), the type of the substrate (Sample 37) and the thickness of the dielectric film (Sample 38) might be different.

As described above, the present invention relates to the amorphous dielectric film and the electronic component. In the dielectric of the present invention, the withstand voltage can be increased without deteriorating the relative permittivity and the temperature coefficient of electrostatic capacitance. In this respect, the downsizing and performance improvement of the electronic component using such a dielectric film can be realized. The present invention can widely provide new technologies to, for example, the thin film capacitor and the thin film component with high frequency which use the dielectric film.

DESCRIPTION OF REFERENCE NUMERALS

1 . . . supporting substrate
2 . . . ground layer
3 . . . lower electrode
4 . . . dielectric film
5 . . . upper electrode
10 . . . thin film capacitor

What is claimed is:

1. An amorphous dielectric film, consisting of:
   an amorphous composition with an A-B—O compound as the main component, the A-B—O compound being represented by the following formula:

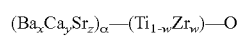

wherein:
   $0 \le x \le 1$, $0 \le y \le 1$, and $0 \le z \le 1$;
   $x+y+z=1$;
   at least two of x, y, and z are 0.1 or more;
   B comprises Zr;
   α=A/B;
   $0.75 \le w \le 1$; and
   $0.5 \le \alpha \le 1.5$.

2. An electronic component comprising the amorphous dielectric film of claim 1.

* * * * *